United States Patent
Shi et al.

(12) United States Patent (10) Patent No.: US 6,862,184 B2
(45) Date of Patent: Mar. 1, 2005

(54) HIGH PERFORMANCE MICROPROCESSOR POWER DELIVERY SOLUTION USING FLEX CONNECTIONS

(75) Inventors: Weimin Shi, Portland, OR (US); Zane A. Ball, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 214 days.

(21) Appl. No.: 10/185,194

(22) Filed: Jun. 27, 2002

(65) Prior Publication Data

US 2004/0002235 A1 Jan. 1, 2004

(51) Int. Cl.[7] .................................................. H05K 7/20
(52) U.S. Cl. ..................... 361/719; 361/704; 361/760; 361/720; 174/260; 174/16.3
(58) Field of Search ................................ 361/676, 683, 361/687–717, 719, 721–725, 749, 752, 813–818; 165/80.2, 80.3, 80.4, 104.33, 104.14, 104.2, 104.32, 185, 104.36, 104.21; 257/706–727; 174/16.1, 16.3, 52.1, 252, 35 R, 35 MS; 62/223, 259.2

(56) References Cited

U.S. PATENT DOCUMENTS

| | | | | |
|---|---|---|---|---|
| 5,963,427 A | * | 10/1999 | Bollesen | 361/704 |
| 5,980,267 A | | 11/1999 | Ayers et al. | |
| 6,191,945 B1 | * | 2/2001 | Belady et al. | 361/704 |
| 6,285,550 B1 | * | 9/2001 | Belady | 361/704 |
| 6,452,113 B2 | * | 9/2002 | Dibene | 174/260 |
| 6,452,804 B1 | * | 9/2002 | Dibene | 361/720 |
| 6,594,556 B1 | * | 7/2003 | Agatstein et al. | 700/298 |
| 2002/0105791 A1 | * | 8/2002 | Harrison et al. | 361/803 |
| 2003/0062602 A1 | * | 4/2003 | Frutschy et al. | 257/666 |
| 2003/0181075 A1 | * | 9/2003 | Hartke et al. | 439/67 |
| 2003/0198033 A1 | * | 10/2003 | Panella et al. | 361/760 |
| 2003/0202330 A1 | * | 10/2003 | Lopata et al. | 361/760 |

* cited by examiner

Primary Examiner—Michael Datskovsky
(74) Attorney, Agent, or Firm—Blakely, Sokoloff, Taylor & Zafman LLP (57) ABSTRACT

An electronic assembly is disclosed which includes a printed circuit board. A computer processor package is centrally positioned on an upper surface of the printed circuit board. A computer processor is positioned on an upper surface of the computer processor package. A first plurality of power delivery components is positioned on an upper surface of the printed circuit board on one side of the computer processor package. One or more additional pluralities of power delivery components may be positioned on the upper surface of the printed circuit board on other sides of the computer processor package. A high frequency current may be routed from one or more of the first and/or additional pluralities of power delivery components over an elongate flex circuit to the computer processor. A series of decoupling capacitors may be coupled to the elongate flex circuit to enhance a transfer of high frequency current over the elongate flex circuit.

23 Claims, 8 Drawing Sheets

HIGH PERFORMANCE MICROPROCESSOR POWER DELIVERY SOLUTION USING FLEX CONNECTIONS

BACKGROUND OF THE INVENTION

1. Field of the Invention

This invention relates to computer systems generally and to power delivery systems for computer processors.

2. Discussion of Related Art

Traditional computer processor power delivery systems include a plurality of voltage regulators and bulk capacitors mounted on an upper surface of a printed circuit board (PCB) in an area adjacent to one side of the computer processor package. The remaining areas surrounding the package are occupied by signal traces and other electrical components. This arrangement becomes problematic as technology advances because it leaves no room to install additional power delivery systems that provide the high frequency currents which multi-giga hertz processors require.

For example, if too many voltage regulators and bulk capacitors are crowded together, the resulting heat generated by operation of these devices degrades overall system performance and/or requires the use of special heat-resistant PCB materials. Additionally, the amount of transient high frequency current delivered to the processor is limited by the PCB's current path parasitic (inductance and resistance). This parasitic is difficult to reduce, except by creating additional layers on the PCB, which is expensive. Finally, each increase in processor speed necessitates a corresponding increase in the number of power pins included in the processor package. This also increases overall system cost because the additional pins and their associated electrical connections must be built into the PCB.

BRIEF DESCRIPTION OF THE DRAWINGS

The present invention is illustrated by way of example, and not limitation, in the figures of the accompanying drawings, in which.

DETAILED DESCRIPTION

Figure 1:
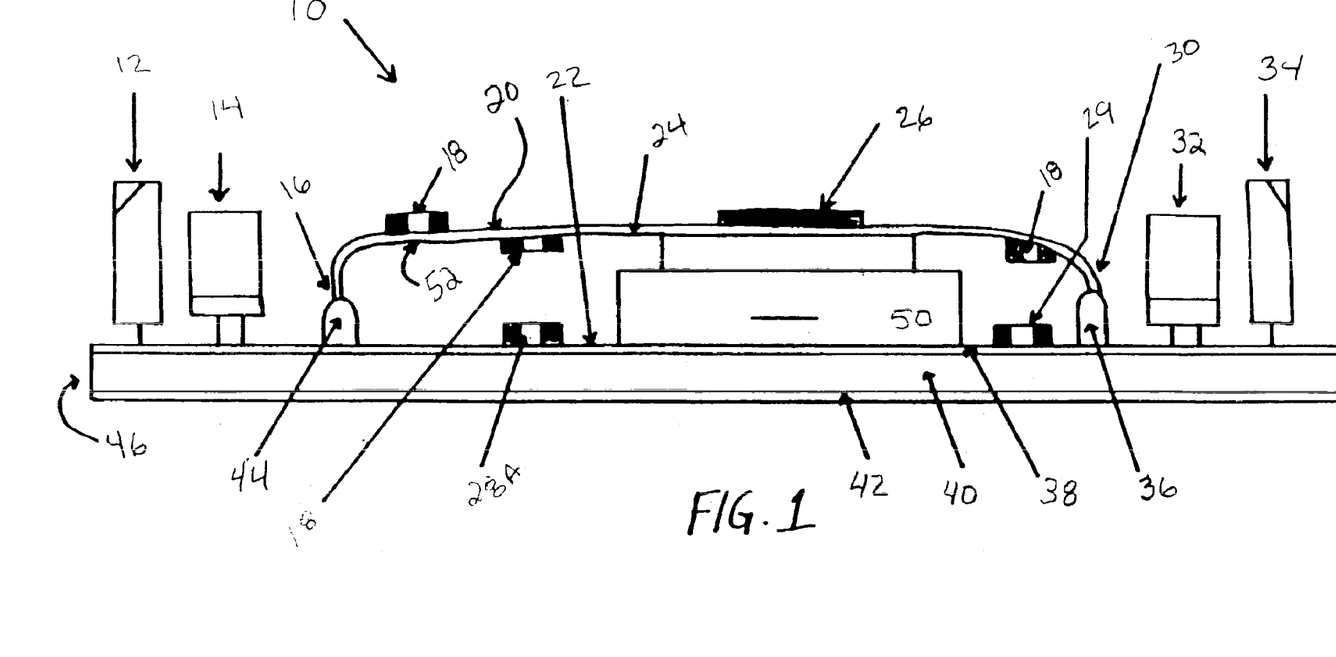
FIG. 1 is a side view of a printed circuit board having an elongate flex circuit coupled to a power delivery system and to a computer processor, according to one embodiment of the invention.

FIG. 1 is a diagram illustrating one embodiment of an electronic assembly 10. The electronic assembly 10 includes a printed circuit board (PCB) 46, a package 50, a computer processor (hereinafter, processor) 26, voltage regulator 12, bulk capacitors 14, a flex circuit power bridge 24, flex circuit connectors 36 and 44, decoupling capacitors 18, decoupling capacitors 28, voltage regulators 34, and bulk capacitors 32.

The PCB 46 is of a type known to persons of ordinary skill in the art. In brief, the multilayered PCB 46 includes an upper layer 38, a middle layer 40, and a lower layer 42. The layers 38 and 42 are formed of an electrically conductive material in the form of copper. The copper layers 38 and 42 are separated by a layer of dielectric material 40. Traces and vias (not shown) formed in the PCB 46 create electrical pathways that connect various electrical components 12, 14, 28, 32, and 34 to other portions of the PCB 46.

Although not shown, a card edge connector formed along an edge of the PCB 46 is configured to slidably engage a plurality of electrical contacts when the card edge connector is slidably inserted within a corresponding receptacle. Electrical traces within the receptacle connect the plurality of electrical contacts to additional electronic components on other PCB's in the same or other devices.

The package 50 is connected to an upper surface 22 of the PCB 46 and is positioned in a central region of the PCB 46, as shown in FIG. 1. The package 50 is of a type known to persons of ordinary skill in the art and includes a plurality of internal traces that connect a plurality of power pin receptacles formed in an upper surface of the package 50 to various electrical components on the PCB 46 and other PCB's.

The processor 26 is semiconductor dielectric electrically connected to the plurality of traces internal to the package 50. As FIG. 1 illustrates, the processor 26 is centrally positioned on an upper surface of the package 50. The processor 26 is a computer processor of the type know to persons of ordinary skill in the art in the form of a G4 processor manufactured by Apple Computer of Cupertino, Calif. or a PC processor manufactured by Intel Corporation of Santa Clara, Calif.

A first delivery system positioned on the left side of the PCB 46 in FIG. 1 includes the voltage regulators 12, the bulk capacitors 14, and the decoupling capacitors 28A. A second power delivery system positioned on the right hand side of the PCB 46 in FIG. 1 includes the voltage regulators 34, the bulk capacitors 32, and the decoupling capacitors 29. The voltage regulators 12 and 34, the bulk capacitors 14 and 32, and the decoupling capacitors 28 and 29 are of types known to persons of ordinary skill in the art. The particular operating parameters of these electrical components will vary according to the type of processor 26 used. As shown in FIG. 1, each of the electrical components 12, 14, 28, 29, 32, and 34 is connected to the upper surface 22 of the PCB 46.

Traditionally, both power delivery systems would be configured to route current through the high inductance PCB 46 to the package 50. However, in the new and advantageous embodiment shown in FIG. 1, one or both of the power delivery systems are configured to deliver current to the package 50 via the low inductance flex circuit power bridge 24.

Positioned between the processor 26 and the voltage regulators 12 and/or 34, the flex circuit power bridge 24 is a wide, flexible member having a first end 16 connected to a flex connector 44 and having a second end 30 connected to a second flex connector 36. The first flex connector 44 is positioned on an upper surface 22 of the PCB 46 between the voltage regulator 12 and the package 50. The second flex connector 36 is positioned on an upper surface of the PCB 46 between the voltage regulator 34 and the package 50. Both of the flex connectors 44 and 36 are electrically connected to traces formed in/on the PCB 46 that connect to the voltage regulators 12 and 34 and the bulk capacitors 14 and 32. The decoupling capacitors 28 are connected to either the flex connector 44 or to the package 50. The decoupling capacitors 29 are connected to either the flex connector 44 or to the package 50.

Referring again to the flex circuit power bridge 24, the flexible member arches upwardly from the flex connectors 44 and 36 to contactingly cover the upper surface of the package 50. As explained with respect to FIG. 2 and following, the portion of the flex circuit power bridge 24 contacting the package 50 includes one or more electrical conductive contact pads positioned on the bottom surface 52 of the flex circuit power bridge 24. The electrically conductive contact pads connect on one side to receptors formed on the top surface of the package 50 and connect on the other side to a plurality of internal traces (or electrically conductive layers) that longitudinally extend the length of the flex circuit power bridge 24. Additionally, a portion of the flex circuit power bridge 24 is cut out to fit around the processor 26. A plurality of decoupling capacitors 18 are connected to the upper and lower surfaces, 20 and 52, respectively, of the flex circuit power bridge 24.

As previously mentioned, the flex circuit power bridge has a lower inductance than the PCB 46. Because inductance is inversely proportional to width and proportional to thickness and length, the flex circuit power bridge 24 is made as wide, as thin, and as short as possible. The thickness of the flex circuit power bridge 24 measures less than 1.0 mil, which yields approximately 75.0 percent less inductance than the conventional 4.0 mil. thickness of the PCB 46. The width and length of the flex circuit power bridge 24 varies according to PCB design and according to the type of processor 26 used.

For purposes of illustration, it is assumed that both the first and second power delivery systems are connected to the flex circuit power bridge 24. Because both power delivery systems operate in the same way, only one system will be described.

In use, a low voltage current from the voltage regulators 14 flows through short traces in/on the PCB 46 to the first flex connector 44. Leaving the traces, the low voltage current passes through the first flex connector and into the flex circuit power bridge 24, and flows "downhill" towards the potential well created by the current consuming processor 26. At an interconnection of the flex circuit power bridge 24 and the package 50, the bridged current leaves the flex circuit power bridge 24 and enters the package 50, when it is routed to the plurality of power pins that feed current to the processor 26. Finally, the bridged current is consumed by the processor 26. Transient currents flow on demand from the bulk capacitors 14 over short traces in/on the PCB 46 that connect to the first flex connector 44, through the flex connector 44, over the flex circuit power bridge 24, and into the package 50, where they are routed to the processor 26 for consumption. The transfer of (high frequency) current over the flex circuit power bridge 24 is further enhanced by the plurality of decoupling capacitors 18 connected to the upper and lower surfaces, 20 and 52, respectively, of the flex circuit power bridge.

Use of a flex circuit power bridge 24 offers several advantages over conventional designs. First, as previously mentioned, the inductance of the flex circuit power bridge 24 is substantially less than the inductance of the PCB 46. Consequently, current is transferred to the processor 26 more quickly and more efficiently than conventional PCB designs allow. Second, mounting the decoupling capacitors 18 on the flex circuit power bridge 24 frees up board space and places the capacitors 18 close to the processor 26. Third, arching the flex circuit power bridge 24 into a space above the PCB 46 helps dissipate the heat generated by the current passing through the flex circuit power bridge 24 because air currents circulating past the upper and lower surfaces, 20 and 52, respectively, of the flex circuit power bridge absorb and carry away any excess heat. Fourth, use of a flex circuit power bridge 24 permits a second power delivery system to be connected to the processor 26 without overheating the PCB 46. Fifth, the flex circuit power bridge 24 is manufactured easily and at a low cost. Thus, adding a flex circuit power bridge 24 to the PCB 46 keeps costs down while simultaneously and significantly boosting overall system performance.

Referring again to FIG. 2 a side view of a portion of a flex circuit power bridge 24 is shown. The flex circuit power bridge 24 includes an upper layer 20 in the form of an electrically conductive material and a lower layer 52 in the form of an electrically conductive material. An electrically conductive core 54, having a thickness 60, is separated from the upper layer 20 by an intermediate layer 56 in the form of a dielectric material, and is separated from the lower layer 52 by an intermediate layer 58 in the form of a dielectric material. The exterior surfaces of the upper and lower layers 20 and 52 are coated with a flexible protective covering.

Figure 2:
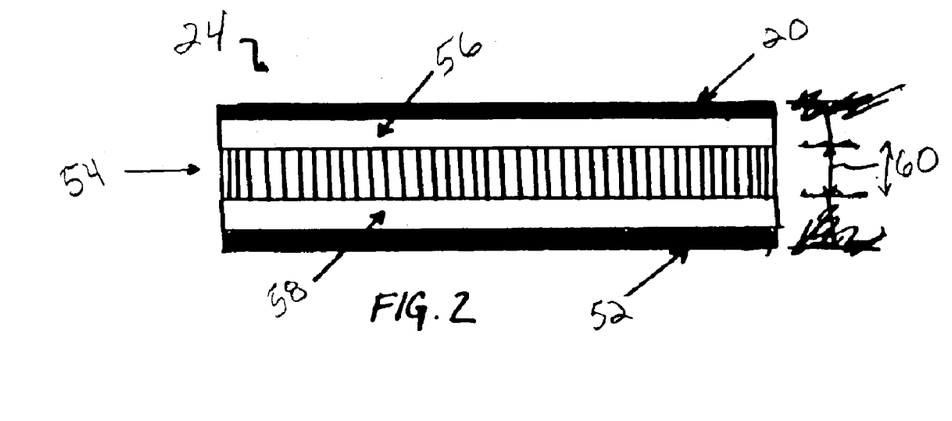
FIG. 2 is a cross-sectional side view the elongate flex circuit shown in FIG. 1.
Figure 3:
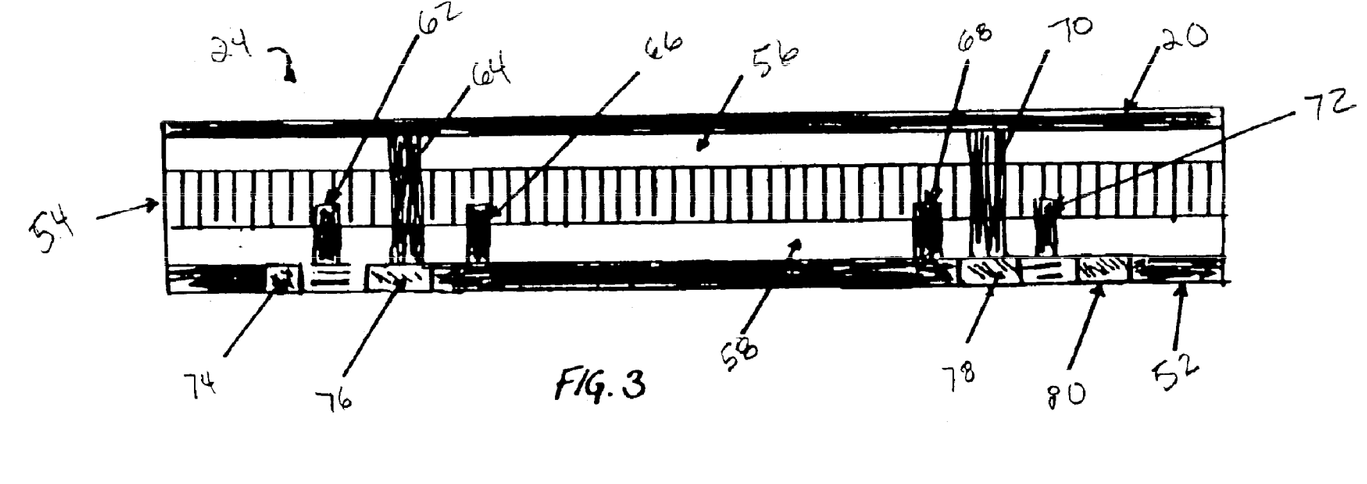
FIG. 3 is another cross-sectional side view of the elongate flex circuit of FIG. 1 illustrating that vias and surface contact pads may be incorporated within the elongate flex circuit, according to one embodiment of the invention.

FIG. 3 is a cross-sectional side view of a portion of the flex circuit power bridge 24 that contacts the upper surface of the package 50. As shown in FIG. 2, the flex circuit power bridge 24 of FIG. 3 includes an electrically conductive upper layer 20, an electrically conductive lower layer 52, and an inner core 54 separated from the upper layer 20 by a dielectric layer 56 and from the lower layer 52 by a dielectric layer 58. As shown, the upper layer 20 is a Vcc layer and the lower layer 52 is a ground layer. A plurality of electrical contacts 74, 76, 78, and 80 are formed in the lower layer 52, such that the electrical contact areas are accessible though openings in the protective material surrounding the lower layer 52. As further discussed below, the electrical contacts 74, 76, 78, and 80 connect to receptors formed on the upper surface of the package 50. As illustrated in FIG. 3, vias 64 and 70 connect the upper Vcc layer 20 to Vcc contact pads 76 and 78, respectively. Vias 62, 66, 68, and 72 connect the inner core 54 to the lower ground layer 52. The vias 62–72 are formed from a solid electrically conductive material in the form of copper.

Figure 4:
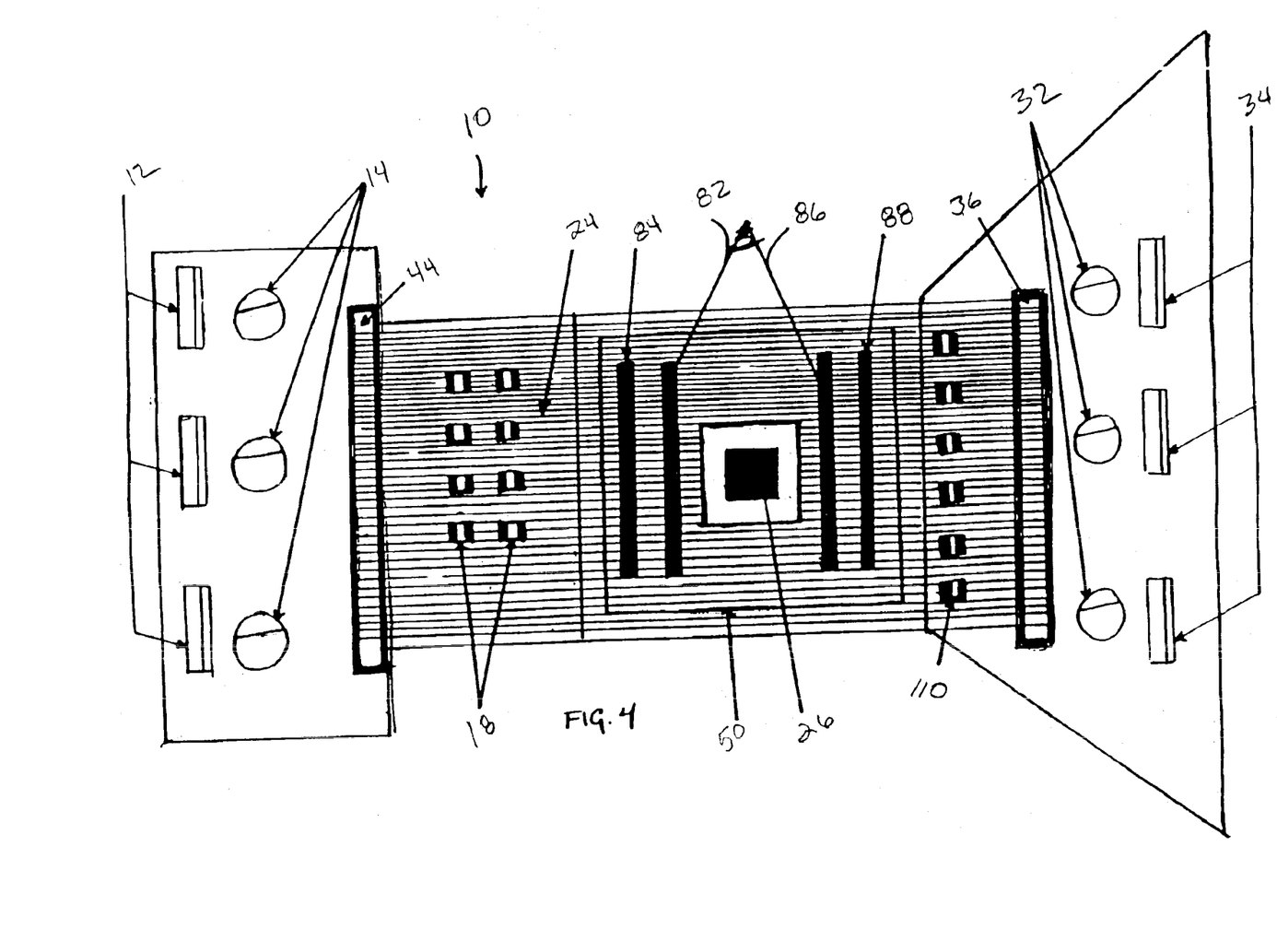
FIG. 4 is a top view of the electronic assembly of FIG. 1 showing the plurality electrical interconnectors attached to an upper surface of the processor package.

FIG. 4 is a top view of the electronic assembly 10 of FIG. 1 showing placement of the voltage regulators 12, the bulk capacitors 14, the flex connectors 44 and 36, the package 50, the processor 26, the flex circuit power bridge 24, the decoupling capacitors 18, the bulk capacitors 32, and the voltage regulators 34. The voltage regulators 12 and the bulk capacitors 14 are positioned on a left side of the PCB 46. The package 50, with the processor 26 centrally mounted on a top surface thereof, is centrally positioned on the PCB 46. The voltage regulators 34 and the bulk capacitors 32 are positioned on a right hand side of the PCB 46. A first flex connector 44 is positioned on the PCB 46 between the row of voltage regulators 12 and the package 50. A second flex connector 36 is positioned on the PCB 46 between the package 50 and the row of voltage regulators 34. The flex circuit power bridge 24 is connected at one end to the flex connector 44 and is connected at the other end to the flex connector 36. A plurality of decoupling capacitors 18 are connected to the upper surface of the flex circuit power bridge 24. A central portion of the flex circuit power bridge 24 contacts the Vcc receptor 82, the ground receptor 84, the Vcc receptor 86, and the ground receptor 88 that are formed in the top surface of the package 50. Each receptor is an elongate piece of electrically conductive material in the form of copper that spans approximately the width of the flex circuit power bridge 24.

In use, the receptors 82, 84, 86, and 88 contact corresponding contact pads 74, 76, 78, and 80 (FIG. 3). A high frequency current carried by the flex circuit power bridge 24 flows through the contact pads 76 and 78 to the receptors 84 and 86 and into the package 50 where it is then routed to the processor 26 for consumption.

Figure 5:
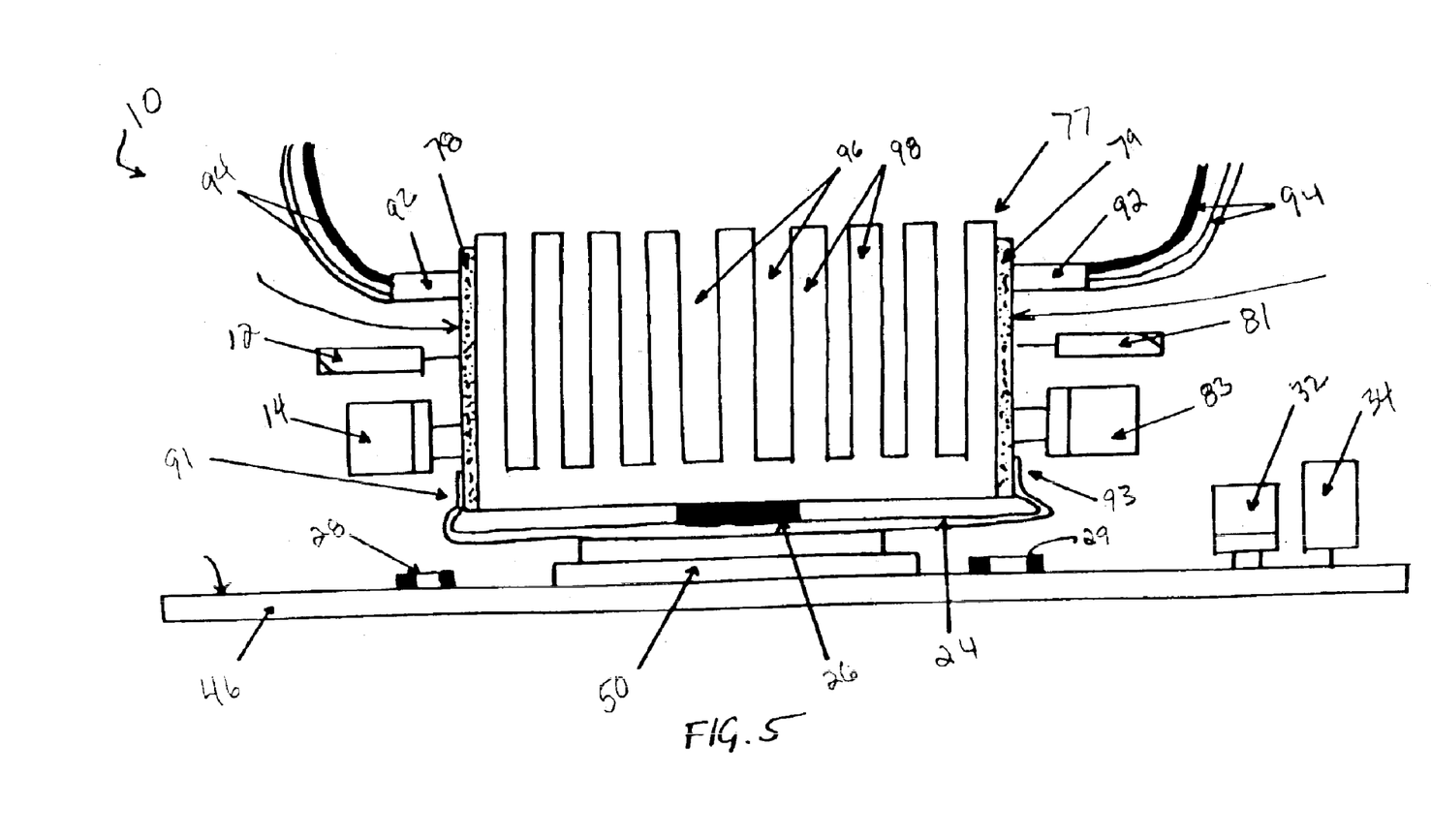
FIG. 5 is a side view of a printed circuit board having a heat sink attached to an upper surface of a computer processor and having an elongate flex circuit coupled to the computer processor and to a power supply removably attached to a side of the heat sink.

FIG. 5 is a diagram illustrating a first alternative embodiment of the electronic assembly 10, of FIG. 1. In FIG. 5, the electronic assembly 10 includes a PCB 46, a package 50, a processor 26, a first, second, and third power delivery system, a heat sink 77, flex circuit connectors 91 and 93, decoupling capacitors 28 and 29, and a flex circuit power bridge 24. With the exception of the power delivery system, the heat sink 77, and the flex circuit connectors, the other named components are the same as previously described.

The heat sink 77 is a multifinned air-cooled device of the type known to persons skilled in the art, and is connected to an upper surface of the processor 26 to dissipate excess heat generated by the processor 26. The fins 98, of the heat sink 77 are separated by air channels 97, through which air circulates to cool the heat sink 77.

The flex connectors 91 and 93 are stiffened pieces of flex circuit that are removably attached to either side of the heat sink 77 by fasteners in the form of screws. Unlike the flex connectors 44 and 36 of FIG. 1, the flex connectors 91 and 93 of FIG. 5 do not contact the PCB 46. Instead, the flex connectors 91 and 93 provide a means of mounting additional power delivery systems close to the processor 26 without crowding available board space.

Formed in the left side 78 of the heat sink 77 of FIG. 5, the first power delivery system includes the power cables 94, a power cable connector 92, the voltage regulators 12, and the bulk capacitors 14. Formed on the right side 79 of the heat sink 77 of FIG. 5, the second power delivery system includes the power cables 94, the power cable connector 92, the voltage regulators 81, and the bulk capacitors 83. A third power delivery system formed on the PCB 46 includes the voltage regulators 34, the bulk capacitors 32, and the decoupling capacitor 29. As shown, one end of the flex circuit power bridge 24 is connected to the flex connector 91. The other end of the flex circuit power bridge 24 is connected to the flex connector 93. A heat sink retention mechanism fastens the heat sink 77 to the processor 26, and the pressure exerted thereby also mates the flex circuit power bridge contact pads to the corresponding receptors formed on the top surface of the package 50. To ensure proper alignment of the contact pads and the receptors, one or more alignment devices are formed on the bottom surface of the flex circuit power bridge and/or on the top surface of the package 50.

In use, the processor 26 draws current from all three power delivery systems simultaneously (or on demand). The currents provided by the voltage regulators 34 and the bulk capacitors 32 is routed through the high inductance PCB 46 to the package 50 in the traditional manner. The currents provided by the voltage regulators 12 and 81 and by the bulk capacitors 14 and 83 are routed to the package 50 over the low inductance flex circuit power bridge 24 in the manner previously described. Heat generated by the voltage regulators 12 and 81 and by the bulk capacitors 14 and 83 is dissipated by the heat sink 77 and by air flowing around these components. Heat generated in the flex circuit power bridge 24 is dissipated by air flowing over the top and bottom surfaces of the flex circuit power bridge 24.

The electronic assembly 10 of FIG. 5 offers several advantageous over conventional designs. First, the use of a flex circuit power bridge 24, as shown in FIG. 5 allows extra power delivery systems to be placed closer to the processor 26 without taking up available board space. Second, mounting the flex connectors on the heat sink 77 prevents the additional power delivery systems from overheating. Additionally, making the flex connectors 91 and 93 removable permits easy replacement of a manufacturing flex circuit power bridge 24 or permits swapping of flex circuit power bridge assemblies having different functionalities.

Figure 6:
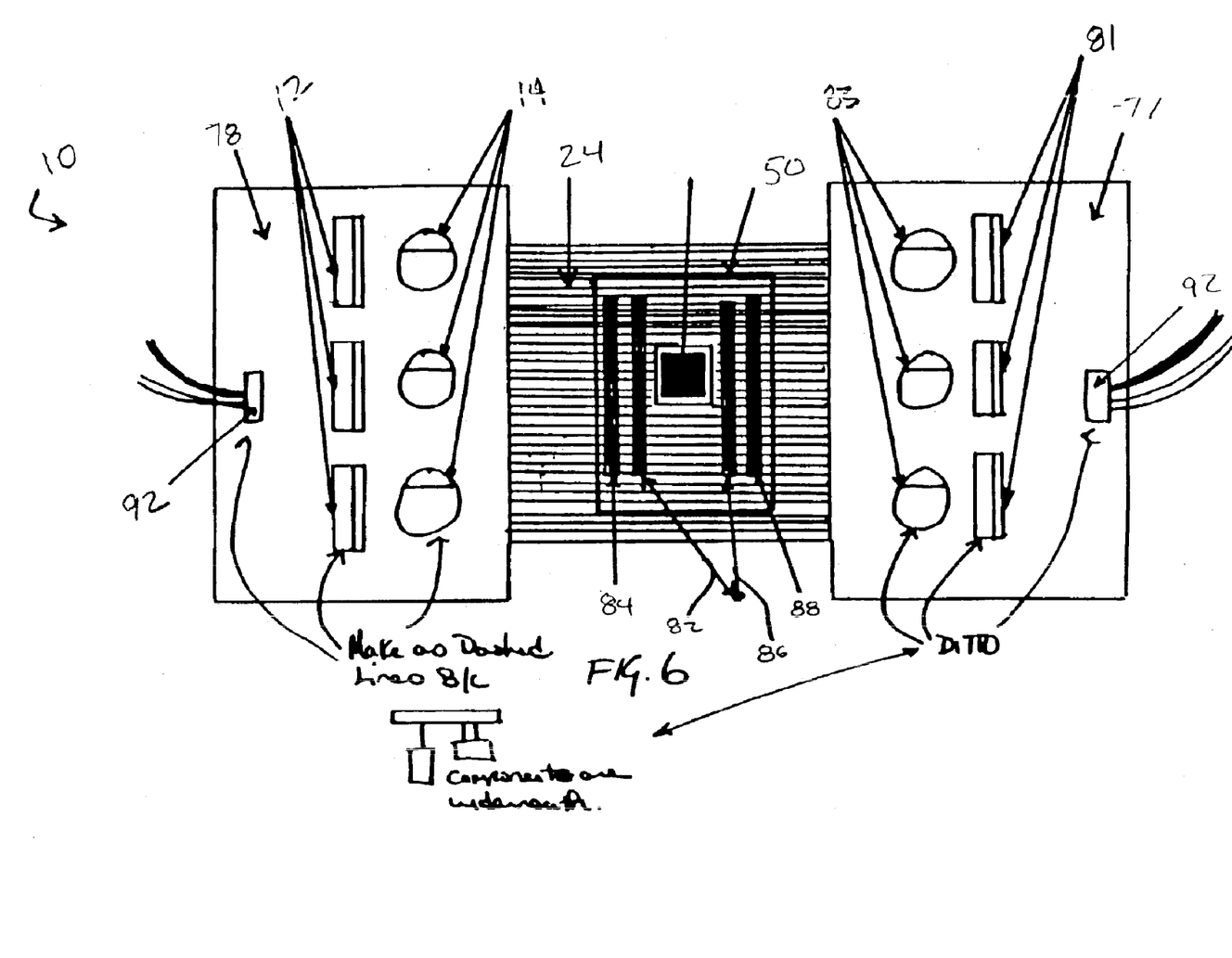
FIG. 6 is a top view of the elongate flex circuit shown in FIG. 5, where the elongate flex circuit is shown removed from the heat sink and oriented in a substantially flattened position.

FIG. 6 is a top view of the flex circuit power bridge assembly 10 of FIG. 5. As shown, the flex connectors 91 and 93 are connected to opposite ends of the flex circuit power bridge 24. The voltage regulators 12 and 81, the bulk capacitors 14, and the power cable connectors 92 are positioned on the bottom of surfaces pf the flex connectors 91 and 93. The receptors 82, 84, 86, and 88 formed on the top surfaces of the package 50 contact corresponding contact pads in the lower layers of the flex circuit power bridge 24 and operate as previously described.

Figure 7:
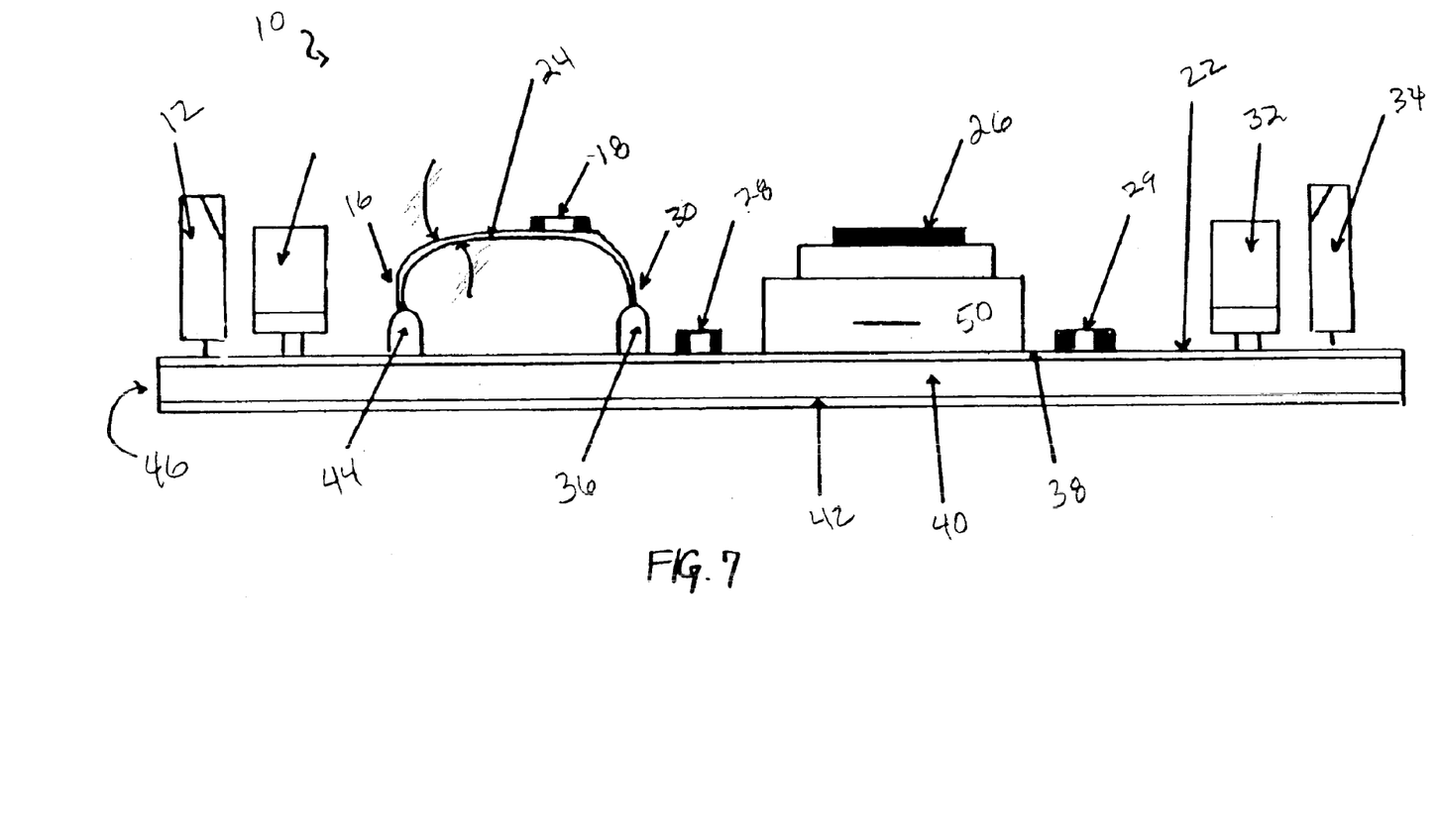
FIG. 7 is a side view of a printed circuit board having elongate flex circuit coupled via electrical connections in the printed circuit board to a power delivery system at one end and to a computer processor at the other.

FIG. 7 is a second alternative embodiment of the electronic assembly 10 of FIG. 1. The electronic assembly 10 of FIG. 7 includes a PCB 46, the voltage regulators 12, bulk capacitors 32, the voltage regulators 34, the decoupling capacitors 18, 28, and 29, flex connectors 44 and 36, and a flex circuit power bridge 24. With the exception of the flex circuit power bridge 24 and the package 50, each of these components is manufactured and operates as previously described.

In FIG. 7, the first and second flex connectors 40 and 36 are positioned on the upper surface 22 of the PCB 46 between the voltage regulators 12 and the package 50. The flex circuit power bridge is connected at one end 16 to the first flex connector 44 and is connected at the other end 30 to the second flex connector 36.

In use, low voltage current from the voltage regulators 12 flows over short traces in/on the PCB 46 to the first flex circuit connector 44. Leaving the traces, the low voltage current flows through the flex connector 44, over the low inductance flex circuit power bridge 24, to the second flex connector 36. Leaving the second flex connector 36, the current flows over a second set of short traces in/on the PCB 46 to reach the package 50, where it is then routed to the processor 26 for consumption. Transient current provided by the bulk capacitors flows on demand to the processor 26 over the same current path.

In contrast, low voltage current and transient currents from the voltage regulators 34 and the bulk capacitors 32 are routed to the package 50 through the high inductance PCB 46, in the conventional manner.

The alternative embodiment of FIG. 7 has several advantages. First, a current from a second power delivery system is quickly and efficiently routed to the processor 26 via the low inductance flex circuit power bridge 24. Second, arching the flex circuit power bridge 24 above the PCB 46 frees board space and permits air-cooling of the flex circuit power bridge 24. Additionally, one or more decoupling capacitors 18 mounted on the flex circuit power bridge 24 in closer proximity to the processor 26.

Figure 8:
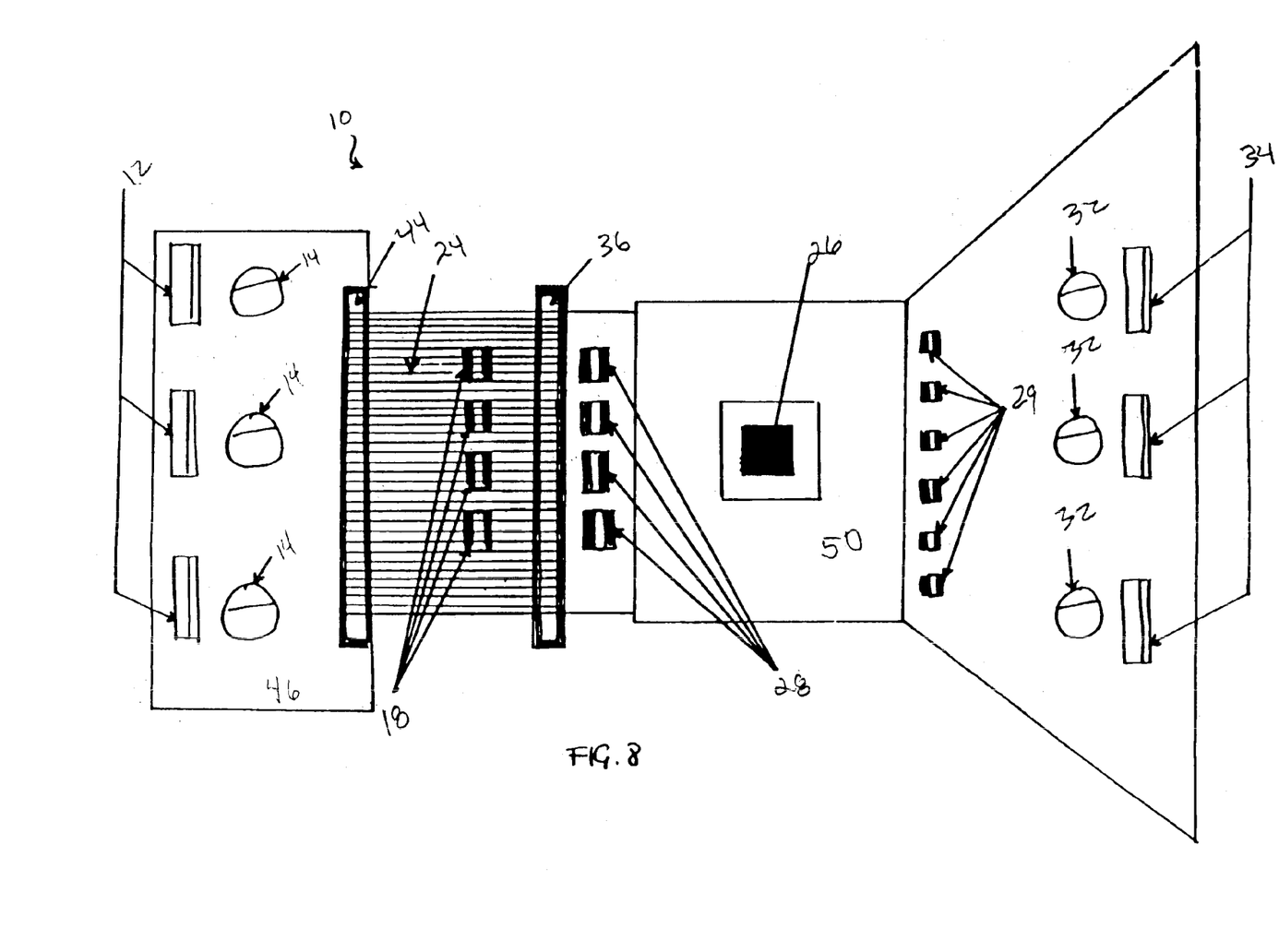
FIG. 8 is a top view of an electronic assembly of FIG. 7, according to one embodiment of the invention.

FIG. 8 is a top view of the electronic assembly 10 of FIG. 7. In FIG. 8 a first power delivery system positioned on the left side of the PCB 46 includes a row of voltage regulators 12, a row of bulk capacitors 14, and decoupling capacitors 28. The package 50, with a processor 26 centrally mounted thereon, is centrally positioned on the PCB 46. Positioned on the PCB 46 to the right of the package 50 is a second power delivery system that includes a row of voltage regulators 34, a row of bulk capacitors 32, and a row of decoupling capacitors 29.

Figure 9:
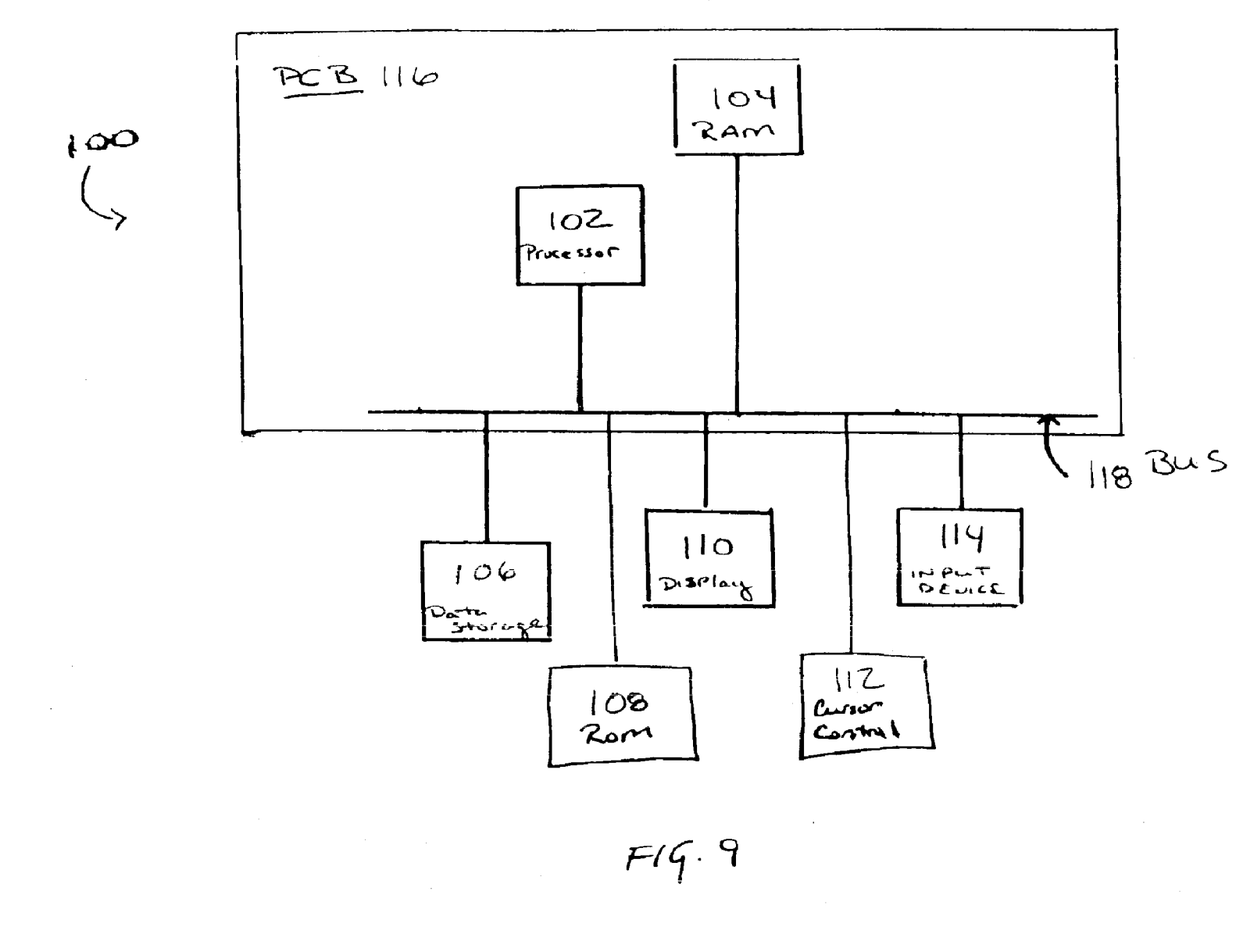
FIG. 9 is a diagram illustrating components of a computer system useable with embodiments of the present invention.

FIG. 9 is a block diagram illustrating one embodiment of a computer system 100 usable with embodiments of the present invention. The computer system 100 is a desktop computer system that includes a PCB 116 (corresponding to the PCB 46 of FIG. 1 and following), a processor 102 (corresponding to processor 26 of FIGS. 1 and following), a random a random access memory (RAM) 104, a data storage 106, a read only memory (ROM) 108, a display device 110, a cursor control device 112, and a data input device 114. Additional components that may be linked to the processor 102 via the bus 118 include networking, wireless, and Internet devices, as well as peripheral devices in the form of digital cameras, printers, and scanners.

Referring to FIG. 9, the processor 102 is an Intel PC processor manufactured by Intel Corporation of Santa Clara, Calif. Positioned on the PCB 116 and connected to the bus 118, the processor 102 is configured to execute computer executable instructions received or retrieved from the data storage device 106, the device RAM 104, the device ROM 108, the cursor control device 112, or the input device 114. Additionally, the processor 102 is configured to transmit command instructions to each of the above-named devices, including the display device 110.

The RAM device 104 is of a type known to persons of ordinary skill in the art and is positioned on the PCB 116 and connects to the processor via the bus 118. The RAM device is used for storing temporary variables or other intermediate information during execution of instructions by the processor 102.

The data storage device 106 is a machine-readable medium in the form of a floppy disk, a CD-ROM disk, or a DVD-RW disk and its corresponding drive. The data storage device stores static information and instructions for the processor 102.

Rom 108 is a read-only machine-readable medium capable of storing instructions for the processor 102 to execute. The ROM 108 may take the form of a CD-ROM disk and player.

The display device 110 is a flat panel display of the type known by persons of ordinary skill in the art. The display device presents a graphical user interface that a human user uses to interact with the computer 100. For example, image, textural, or graphical depictions of product data and other types of image, graphical, and textural information may be presented to a user on the display device 110.

The cursor control device 112 is a trackpad or other type of cursor control device known to persons of ordinary skill in the art. The cursor control device 112 controls the movement of the cursor on the display device 110.

The data input device 114 is an alphanumeric keyboard or speech recognition device that transmits user commands into machine executable instructions. Such devices are known to persons or ordinary skill in the art.

Although a desktop system has been described, embodiments of the present invention may also be used in laptop computers, computer servers, or digital electrical devices such as cameras, printers, scanners, photocopiers, and other such devices. Furthermore, the computer 100 may interact with other computer devices over a wireless or conventional wide area network (WAN) or a local area network (LAN).

Although the present invention is described herein with reference to a specific preferred embodiment, many modifications and variations therein will readily occur to those with ordinary skill in the art. Accordingly, all such variations and modifications are included within the intended scope of the present invention as defined by the following claims.

What is claimed is:

1. An electronic assembly, comprising:
   a printed circuit board (PCB);
   a voltage regulator;
   a computer processor package positioned on an upper surface of the PCB;
   a computer processor connected to the computer processor package;
   an elongate flex circuit positioned between the voltage regulator and the computer processor, wherein one end of the elongate flex circuit is electrically coupled to the voltage regulator, wherein a portion of the elongate flex circuit is positioned in a space above the PCB, and wherein another portion of the elongate flex circuit is electrically coupled to the computer processor; and
   a bulk capacitor positioned between the voltage regulator and the elongate flex circuit, the bulk capacitor electrically coupled to the one end of the elongate flex circuit.

2. The electronic assembly of claim 1, further comprising:
   one or more decoupling capacitors electrically coupled to the elongate flex circuit and positioned between the ends of the elongate flex circuit and the computer processor.

3. The electronic assembly of claim 2, wherein the elongate flex circuit has an inductance less than an inductance of the PCB.

4. The electronic assembly of claim 3, further comprising:
   a bus coupled to the computer processor;
   a display device coupled to the bus;
   an input device coupled to the bus; and
   a memory device coupled to the bus.

5. The electronic assembly of claim 3, wherein the voltage regulator is positioned on the upper surface of the PCB, and wherein the ends of the elongate flex circuit are coupled to the upper surface of the PCB in a space between the voltage regulator and the computer processor package.

6. The electronic assembly of claim 3, further comprising:
   a second voltage regulator electrically coupled to a second end of the elongate flex circuit; and
   a second bulk capacitor positioned between the second voltage regulator and the second end of the elongate flex circuit, the second bulk capacitor electrically coupled to the second end of the elongate flex circuit.

7. The electronic assembly of claim 6, wherein the ends of the elongate flex circuit are removably coupled to the upper surface of the PCB on either side of the computer processor package.

8. The electronic assembly of claim 6, further comprising:
a heat sink coupled to an upper surface of the computer processor.

9. The electronic assembly of claim 8, wherein the ends of the elongate flex circuit are removably coupled to opposite sides of the heat sink.

10. The electronic assembly of claim 3, wherein the elongate flex circuit includes:
a first electrically conductive layer;
a second electrically conductive layer;
a core sandwiched between the first electrically conductive layer and the second electrically conductive layer;
a first isolate layer covering an upper surface of the first electrically conductive layer; and
a second isolate layer covering a lower surface of the second electrically conductive layer.

11. The electronic assembly of claim 10, wherein the elongate flex circuit further includes:
a ground contact area formed on the lower surface of the second electrically conductive layer and not covered by the second isolate layer; and
a Vcc contact area formed on the lower surface of the second electrically conductive layer and not covered by the second isolate layer.

12. An electronic device, comprising:
a printed circuit board (PCB);
a power bus coupled to the PCB;
a data bus coupled to the PCB;
a computer processor package positioned on an upper surface of the PCB and coupled to the power bus;
a computer processor positioned on the computer processor package and coupled to the power bus and to the data bus;
a voltage regulator;
an elongate flex circuit positioned between the voltage regulator and the computer processor, wherein one end of the elongate flex circuit is electrically coupled to the voltage regulator, wherein a portion of the elongate flex circuit is positioned in a space above the PCB, and wherein another portion of the elongate flex circuit is electrically coupled to the power bus; and
a bulk capacitor positioned between the voltage regulator and the elongate flex circuit, the bulk capacitor electrically coupled to the one end of the elongate flex circuit.

13. The electronic assembly of claim 12, further comprising:
one or more decoupling capacitors electrically coupled to the elongate flex circuit and positioned between the ends of the elongate flex circuit and the computer processor.

14. The electronic assembly of claim 13, wherein the elongate flex circuit has an inductance less than an inductance of the PCB.

15. The electronic assembly of claim 14, further comprising: a second voltage regulator electrically coupled to a second end of the elongate flex circuit; and a second bulk capacitor positioned between the second voltage regulator and the second end of the elongate flex circuit, the second bulk capacitor electrically coupled to the second end of the elongate flex circuit.

16. The electronic assembly of claim 15, further comprising:
a heat sink coupled to an upper surface of the computer processor.

17. The electronic assembly of claim 15, wherein the ends of the elongate flex circuit are removably coupled to the upper surface of the PCB on either side of the computer processor package.

18. The electronic assembly of claim 15, wherein the voltage regulator is positioned on the upper surface of the PCB, and wherein the ends of the elongate flex circuit are coupled to the upper surface of the PCB in a space between the voltage regulator and the computer processor package.

19. The electronic assembly of claim 16, wherein the ends of the elongate flex circuit are removably coupled to opposite sides of the heat sink.

20. The electronic assembly of claim 15, wherein the elongate flex circuit includes:
a first electrically conductive layer;
a second electrically conductive layer;
a core sandwiched between the first electrically conductive layer and the second electrically conductive layer;
a first isolate layer covering an upper surface of the first electrically conductive layer; and
a second isolate layer covering a lower surface of the second electrically conductive layer.

21. The electronic assembly of claim 20, wherein the elongate flex circuit further includes:
a ground contact area formed on the lower surface of the second electrically conductive layer and not covered by the second isolate layer; and
a Vcc contact area formed on the lower surface of the second electrically conductive layer and not covered by the second isolate layer.

22. A method of powering a computer processor, the method comprising:
outputting a first high frequency current from a voltage regulator to an elongate flex circuit;
routing the first high frequency current over the elongate flex circuit to a computer processor package;
routing the first high frequency current from the computer processor package to a computer processor positioned thereon;
outputting a second high frequency current from a bulk capacitor to the elongate flex circuit;
routing the second high frequency current over the elongate flex circuit to the computer processor package; and
routing the second high frequency current from the computer processor package to the computer processor.

23. The method of claim 22, further comprising:
dissipating excess heat by circulating air around portions of the elongate flex circuit that are positioned in a space above the printed circuit board.

* * * * *